United States Patent
Bih et al.

(10) Patent No.: US 10,658,315 B2
(45) Date of Patent: May 19, 2020

(54) REDISTRIBUTION LAYER METALLIC STRUCTURE AND METHOD

(71) Applicant: Taiwan Semiconductor Manufacturing Co., Ltd., Hsin-Chu (TW)

(72) Inventors: Shih Wei Bih, Taichung (TW); Sheng-Wei Yeh, Taichung (TW); Yen-Yu Chen, Taichung (TW); Wen-Hao Cheng, Hsinchu (TW); Chih-Wei Lin, Hsinchu (TW); Chun-Chih Lin, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/937,339

(22) Filed: Mar. 27, 2018

(65) Prior Publication Data

US 2019/0304939 A1   Oct. 3, 2019

(51) Int. Cl.
*H01L 21/02* (2006.01)
*H01L 23/00* (2006.01)

(52) U.S. Cl.
CPC ........ *H01L 24/05* (2013.01); *H01L 21/02068* (2013.01); *H01L 24/03* (2013.01); *H01L 2224/024* (2013.01); *H01L 2224/0239* (2013.01); *H01L 2224/02321* (2013.01); *H01L 2224/02331* (2013.01);
(Continued)

(58) Field of Classification Search
CPC . H01L 24/05; H01L 24/03; H01L 2224/0391; H01L 2224/05647; H01L 2224/02321; H01L 2224/05624; H01L 2224/0239; H01L 2224/02372; H01L 2224/05187; H01L 2224/0345; H01L 2224/02381; H01L 2224/05181; H01L 2224/05083; H01L 2224/05188; H01L 2224/05008; H01L 2224/02331; H01L 2924/04953; H01L 2224/024; H01L 2224/02377
See application file for complete search history.

(56) References Cited

U.S. PATENT DOCUMENTS 5,961,791 A * 10/1999 Frisa ................ C23C 14/0641
                                                       204/192.1
6,664,185 B1    12/2003 Wang et al.
(Continued)

FOREIGN PATENT DOCUMENTS

JP        0653408 A       2/1994
KR     20030040061 A      5/2003
(Continued)

*Primary Examiner* — David Vu
(74) *Attorney, Agent, or Firm* — Haynes and Boone, LLP

(57) ABSTRACT

The present disclosure provides an integrated circuit (IC) structure. The IC structure includes a semiconductor substrate; an interconnection structure formed on the semiconductor substrate; and a redistribution layer (RDL) metallic feature formed on the interconnection structure. The RDL metallic feature further includes a barrier layer disposed on the interconnection structure; a diffusion layer disposed on the barrier layer, wherein the diffusion layer includes metal and oxygen; and a metallic layer disposed on the diffusion layer.

20 Claims, 15 Drawing Sheets

(52) U.S. Cl.
CPC .............. *H01L 2224/02372* (2013.01); *H01L 2224/02377* (2013.01); *H01L 2224/02381* (2013.01); *H01L 2224/035* (2013.01); *H01L 2224/0345* (2013.01); *H01L 2224/0391* (2013.01); *H01L 2224/05008* (2013.01); *H01L 2224/05083* (2013.01); *H01L 2224/05181* (2013.01); *H01L 2224/05187* (2013.01); *H01L 2224/05188* (2013.01); *H01L 2224/05624* (2013.01); *H01L 2224/05647* (2013.01); *H01L 2924/04953* (2013.01); *H01L 2924/0535* (2013.01); *H01L 2924/05994* (2013.01)

(56) References Cited

U.S. PATENT DOCUMENTS

| | | | |
|---|---|---|---|
| 8,987,922 B2 | 3/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,372,206 B2 | 6/2016 | Wu et al. | |
| 9,496,189 B2 | 11/2016 | Yu et al. | |
| 2002/0000665 A1* | 1/2002 | Barr | H01L 21/76801 257/758 |
| 2002/0005583 A1* | 1/2002 | Harada | H01L 24/03 257/758 |
| 2004/0092096 A1 | 5/2004 | Raaijmakers et al. | |
| 2005/0029665 A1 | 2/2005 | Lin et al. | |
| 2005/0127530 A1* | 6/2005 | Fan | H01L 24/03 257/786 |
| 2006/0027925 A1* | 2/2006 | Huang | H01L 21/76844 257/751 |
| 2013/0320522 A1* | 12/2013 | Lai | H01L 24/05 257/737 |
| 2018/0019187 A1 | 1/2018 | Lagouge et al. | |

FOREIGN PATENT DOCUMENTS

| | | |
|---|---|---|
| KR | 20110138135 A | 12/2011 |
| KR | 20170051270 A | 5/2017 |

* cited by examiner

REDISTRIBUTION LAYER METALLIC STRUCTURE AND METHOD

BACKGROUND

In semiconductor industry, integrated circuits (ICs) are formed on a semiconductor substrate and are saw to IC chips. Each IC chip is further attached (such as by bonding) to a circuit board, such as a printed circuit board in electric products. In previous technologies, various bonding pads of the chip are connected to the circuit board through wire bonding. In advanced technologies, a circuit chip is flipped and directly bonded to the circuit board for reduced cost. In this technology, a redistribution layer of conductive metal lines is formed on the chip to reroute bond connections from the edge to the center of the chip. The existing structure of the redistribution layer and the corresponding method cause either metal filling issue, which further causes passivation defect. Therefore, the present disclosure provides a redistribution layer structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
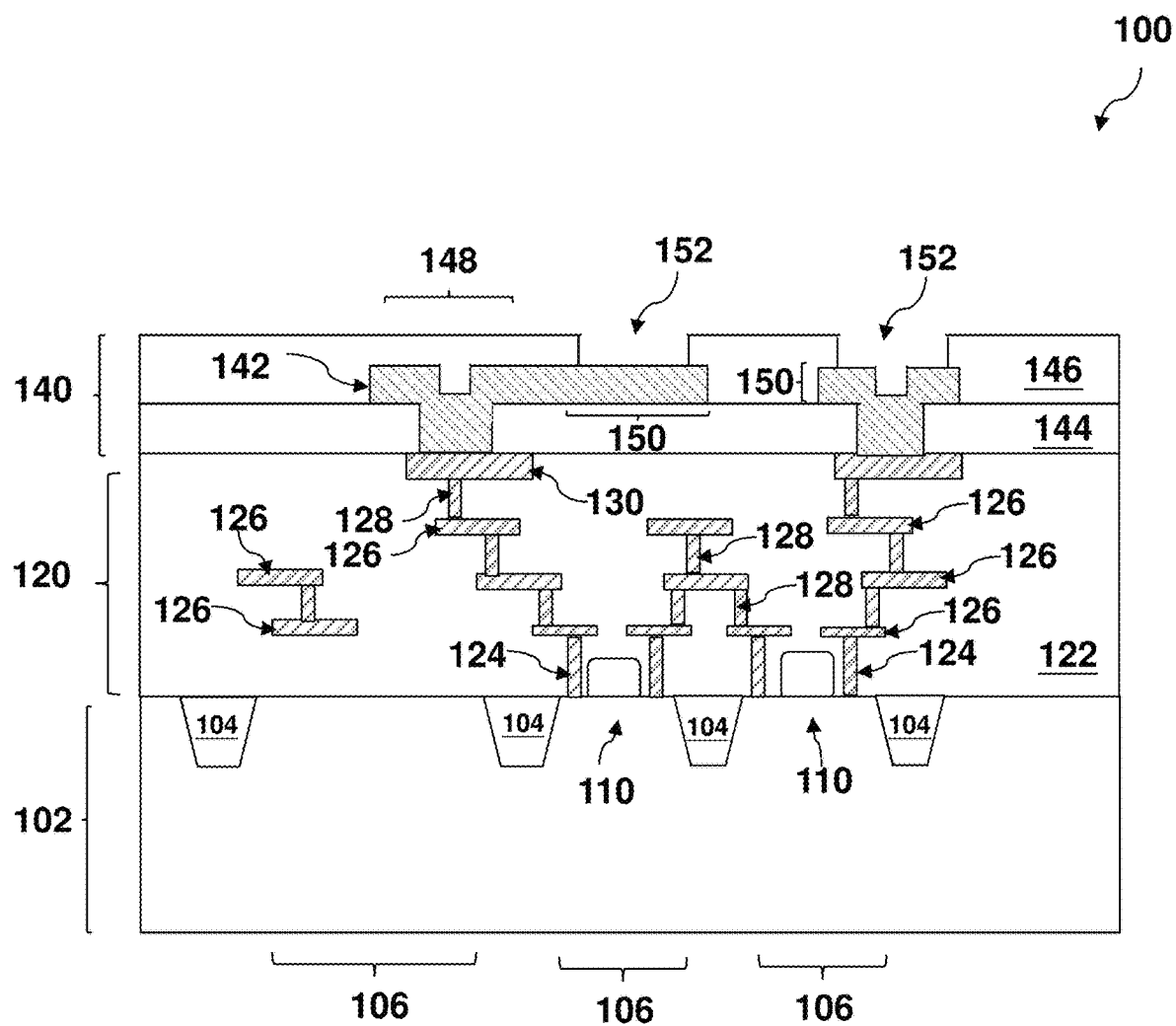
FIG. 1A is a sectional view of a semiconductor device structure having a redistribution layer (RDL) constructed according to various aspects of the present disclosure in some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is to be understood that the following disclosure provides many different embodiments, or examples, for implementing different features of various embodiments. Specific examples of components and arrangements are described below to simplify the present disclosure. These are, of course, merely examples and are not intended to be limiting.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1B:
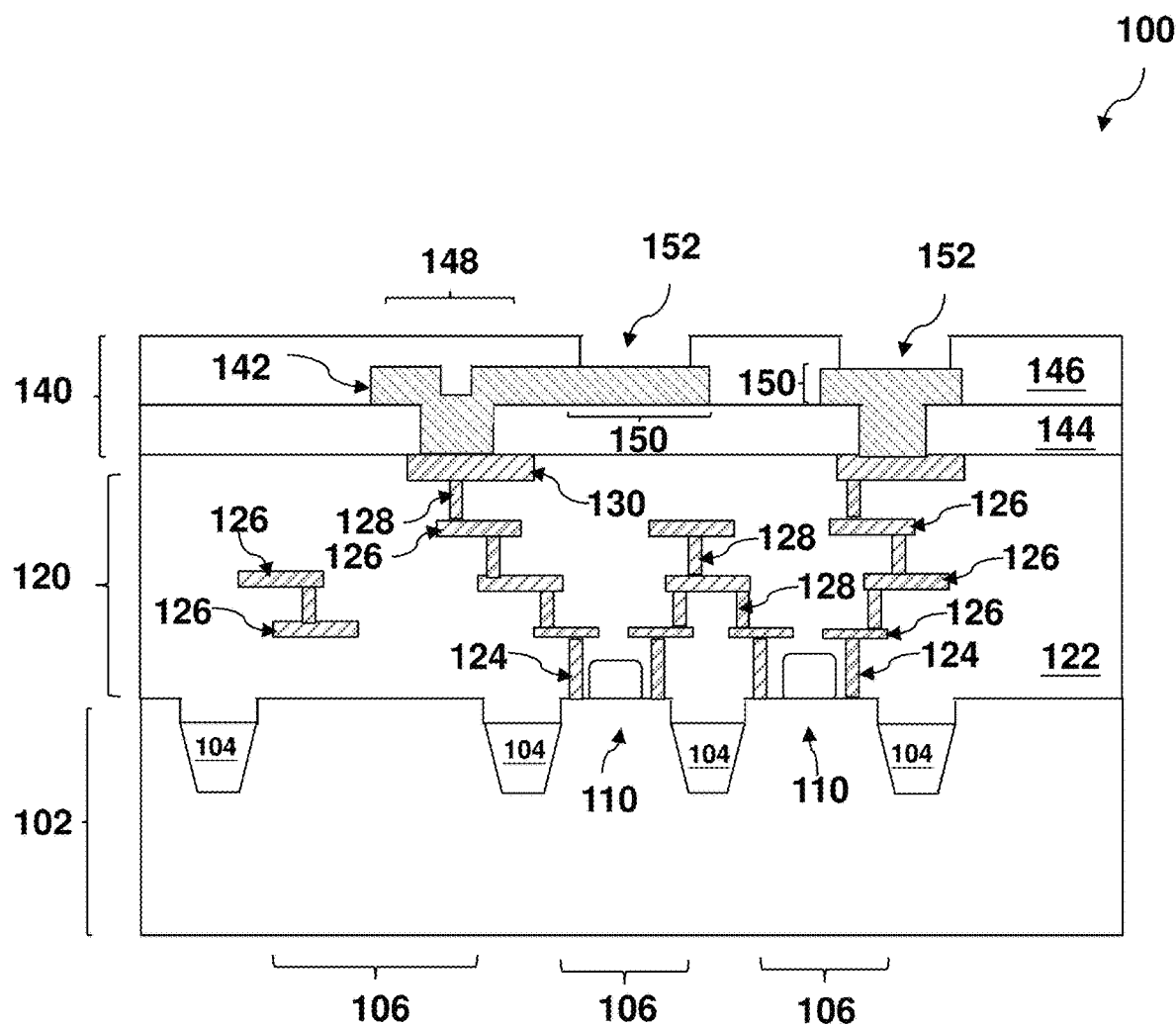
FIG. 1B is a sectional view of a semiconductor device structure constructed according to various aspects of the present disclosure in some other embodiments.
Figure 2:
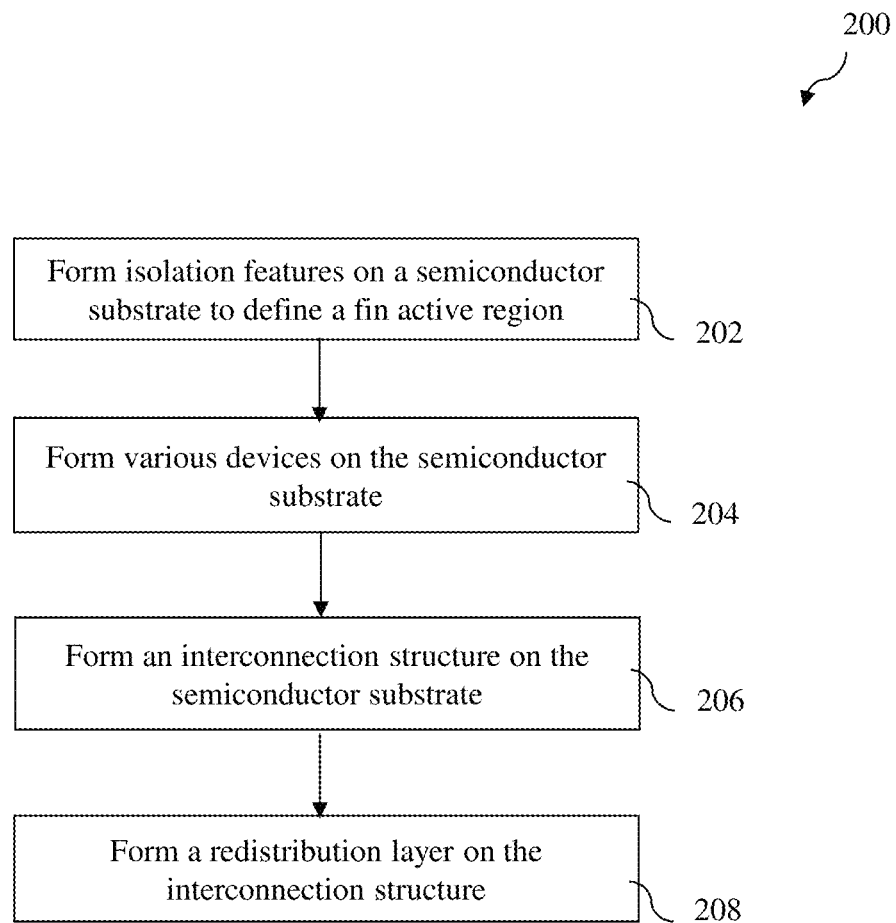
FIG. 2 is a flowchart of a method to fabricate an integrated circuit (IC) structure of FIG. 1 in accordance with some embodiments.

FIG. 1A is a sectional view of an integrated circuit (IC) structure (or semiconductor structure, or a work piece) 100 constructed according to various aspects of the present disclosure in one embodiment. FIG. 1B is a sectional view of the semiconductor structure 100 with fin active regions constructed according to other embodiments. FIG. 2 is a flowchart of a method 200 making the semiconductor structure 100 in accordance with some embodiments. The semiconductor structure 100 and the method 200 making the same are collectively described with reference to FIGS. 1A, 1B, 2, and other figures. In some embodiments, the semiconductor structure 100 includes flat active regions with various IC devices, such as plain field-effect transistors (FETs), formed thereon, as illustrated in FIG. 1A. In some embodiments, the semiconductor structure 100 includes fin active regions with various IC devices formed thereon, as illustrated in FIG. 1B.

The semiconductor structure 100 includes a substrate 102. The substrate 102 includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions on the substrate 102, such as an active region 106. The isolation feature 104 utilizes isolation technology, such as shallow trench isolation (STI), to define and electrically isolate the various active regions. The isolation feature 104 includes silicon oxide, silicon nitride, silicon oxynitride, other suitable dielectric materials, or combinations thereof. The isolation feature 104 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active region 106 is a region with semiconductor surface wherein various doped features are formed and configured to one or more device, such as a diode, a transistor, and/or other suitable devices. The active region may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility.

In some embodiments illustrated in FIG. 1B, the active region 106 is three-dimensional, such as a fin active region extended above the isolation feature 104. The fin active region is extruded from the substrate 102 and has a three-dimensional profile for more effective coupling between the channel region (or simply referred to as channel) and the gate electrode of a FET. The fin active region 106 may be formed by selective etching to recess the isolation features 104, or selective epitaxial growth to grow active regions with a semiconductor same or different from that of the substrate 102, or a combination thereof.

The semiconductor substrate 102 further includes various doped features, such as n-type doped wells, p-type doped wells, source and drain, other doped features, or a combination thereof configured to form various devices or components of the devices. The semiconductor structure 100 includes various IC devices 110 formed on the semiconductor substrate 102. The IC devices includes fin field-effect transistors (FinFETs), diodes, bipolar transistors, imaging sensors, resistors, capacitors, inductors, memory cells, or a combination thereof. In FIG. 1A (or FIG. 1B), FETs are provided only for illustration.

The semiconductor structure 100 further includes an interconnection structure 120 formed on the semiconductor substrate 102. The interconnection structure 120 includes various conductive features to couple various IC devices into an integrated circuit. The interconnection structure 120 further includes an interlayer dielectric (ILD) layer 122 to separate and isolate various conductive features. For examples, the interconnection structure 120 includes contacts 124; metal lines 126; and vias 128. The metal lines 126 are distributed in multiple metal layers. In FIG. 1A, four metal layers are illustrated. The top metal lines are separately labeled with numerical 130. The contacts 124 provide vertical electrical routing from the semiconductor substrate 102 to the metal lines. The vias 128 provide vertical electrical routing between adjacent metal layers. Various conductive features are formed by one or more conductive material, such as metal, metal alloy, or silicide. For examples, the metal lines 126 may include copper, aluminum copper alloy, other suitable conductive material, or a combination thereof. The vias 128 may include copper, aluminum copper alloy, other suitable conductive material, or a combination thereof. The contacts 124 may include tungsten, silicide, nickel, cobalt, copper, other suitable conductive material, or a combination thereof. In some examples, various conductive features may further include a barrier layer, such as tantalum and tantalum nitride, titanium and titanium nitride. In the present embodiment, the top metal lines 130 include copper.

The ILD layer 122 includes one or more dielectric material to provide isolation functions to various device components (such as gates) and various conductive features (such as metal lines, contacts and vias). The ILD layer 122 includes a dielectric material, such as silicon oxide, a low-k dielectric material, other suitable dielectric material, or a combination thereof. In some examples, the low-k dielectric material includes fluorinated silica glass (FSG), carbon doped silicon oxide, Xerogel, Aerogel, amorphous fluorinated carbon, Parylene, BCB (bis-benzocyclobutenes), polyimide, and/or other suitable dielectric materials with dielectric constant substantially less than that of the thermal silicon oxide. The formation of the ILD layer 122 includes deposition and CMP, for examples. The deposition may include spin-on coating, CVD, other suitable deposition technology or a combination thereof. The ILD layer 122 may include multiple layers and is collectively formed with various conductive features in a proper procedure, such as damascene process.

In some embodiments, the interconnection structure 120 or a portion thereof is formed by deposition and patterning. For examples, a metal (or metal alloy), such as aluminum copper is deposited by physical vapor deposition (PVD), then is patterned by lithography process and etching. Then an ILD layer is disposed on by deposition (and CMP). In some embodiments, the interconnect structure 120 uses a damascene process to form metal lines. In a damascene process, an ILD layer is deposited, may be further planarized by CMP, and then is patterned by lithography and etching to form trenches. One or more conductive material is deposited to fill the trenches, and another CMP process is applied to remove the excessive conductive material and planarize the top surface, thereby forming conductive features. The damascene process may be used to form metal lines, vias, and contacts. A dual damascene process may be applied to form one layer of metal lines and vias adjacent the metal lines. In this case, the ILD layer is deposited and patterned twice to form trenches and via holes, respectively. Then the metal is deposited to fill both the trenches and via holes to form metal lines and vias.

The semiconductor structure 100 further includes a redistribution layer (RDL) structure 140 disposed on the interconnection structure 120 to redistribute bonding pads, such as from the edge to the center of an IC chip for flip chip bonding or other suitable packaging technology to integrate an IC chip to a board (e.g., a printed circuit board).

The RDL structure 140 includes passivation and RDL metallic features 142 embedded in the passivation with bonding pads 150 in the openings 152 of the passivation. In the present embodiment, the passivation includes a first passivation layer 144 and a second passivation layer 146 disposed on the first passivation layer 144. The first passivation layer 144 includes a redistribution via (RV) hole aligned to a top metal line 130 so that the portion 148 of a RDL metallic feature 142 is formed in the RV hole and directly contact the top metal line 130. The portion 148 of the RDL metallic feature 142 is also referred to as RV pad 148. The RDL metallic feature 142 vertically extends from the first passivation layer 144 to the second passivation layer 146 and horizontally extends from the RV pad 148 to the bonding pad 150 for pad redistribution.

In the present embodiment, the first passivation layer 144 includes a silicon nitride (SiN) layer and an un-doped silica glass (USG) layer on the SiN layer; and the second passivation layer 144 includes an USG layer and a SiN layer disposed on the USG layer. The RDL metallic features 142 include multiple layers. In the present embodiment, the RDL metallic features 142 include a barrier layer, a diffusion layer disposed on the barrier layer and an aluminum copper alloy layer disposed on the diffusion layer. The barrier layer may further include a tantalum film and a tantalum nitride film disposed on the tantalum film. The diffusion layer is a metal oxide. In the present embodiment, the diffusion layer includes tantalum, oxygen, aluminum, and nitrogen. The diffusion layer has a thickness ranging between 5 angstrom and 30 angstrom. The aluminum copper alloy layer is formed at high temperature greater than 300° C. The RDL structure 140, especially the RDL metallic features 142 are further described in the following descriptions.

FIG. 2 is a flowchart of a method 200 making the semiconductor structure 100 in accordance with some embodiments. Some fabrication details are provided above and are not repeated here. The method 200 includes an operation 202 to form isolation features 104 on the semiconductor substrate 102; an operation 204 to form various IC devices (such as FETs, diodes, passive devices, imaging sensors, memory cells, other suitable IC devices or a combination thereof) on the semiconductor substrate 102; an operation 206 to form an interconnection structure 120 (such as contacts 124, metal lines 126, vias 128 and top metal lines 130) by a suitable method, such as damascene process; and an operation 208 to form a RDL structure 140. The method 200 may include other operations before, during or after the above operations. The method to form the RDL structure 140 is further described in details below.

Figure 3:
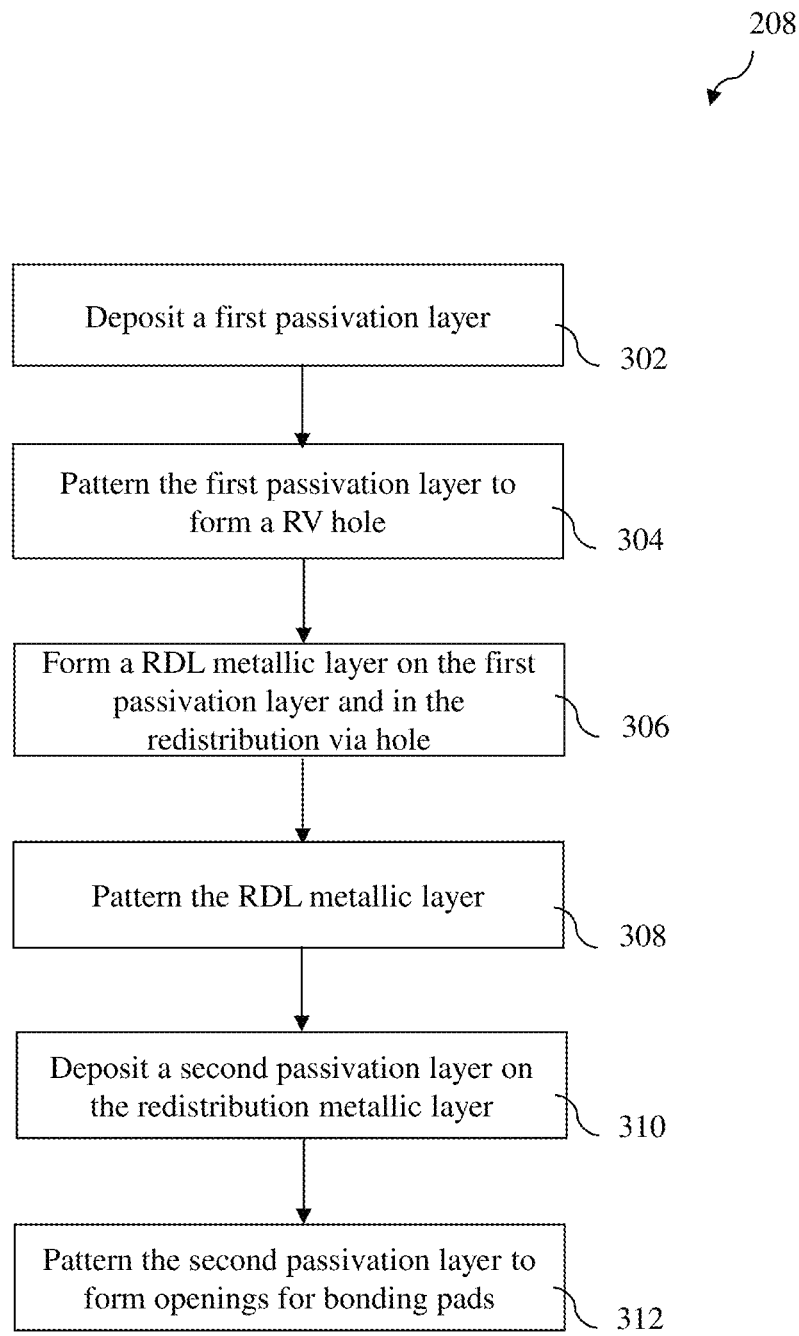
FIG. 3 is a flowchart of a method to make the RDL structure in accordance with some embodiments.
Figure 4:
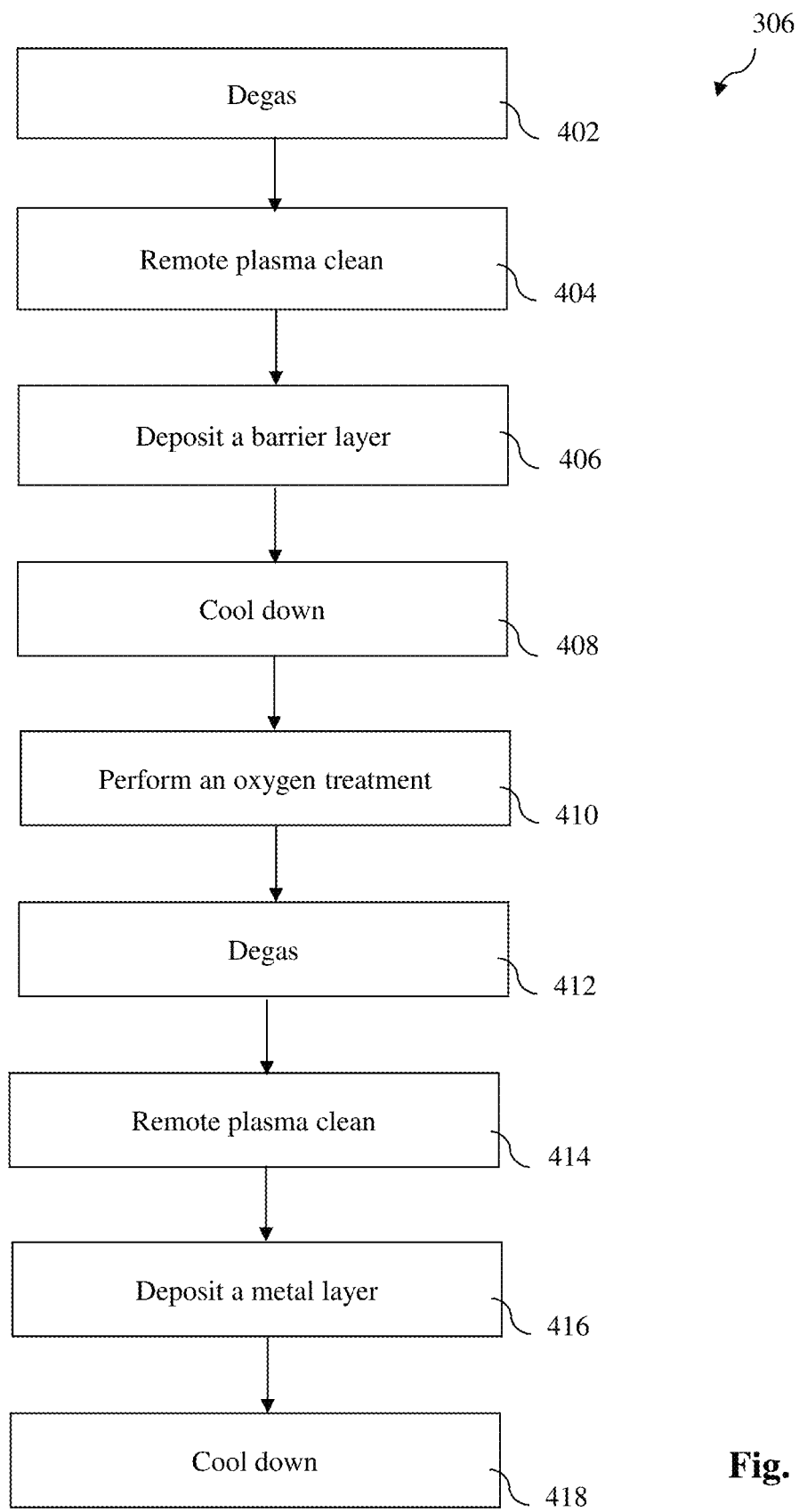
FIG. 4 is a flowchart of a method to make a RDL metallic layer in accordance with some embodiments.

FIG. 3 is a flowchart of a method 208 to form the RDL structure 140 and FIG. 4 is a flowchart of a method 306 to form the RDL metallic features 142 according to some embodiments. FIGS. 5 through 14 are sectional views of the semiconductor structure 100 at various fabrication stages in accordance with some embodiments. The method 208 and the semiconductor structure 100 are collectively described with reference to FIGS. 3 through 14.

Figure 5:
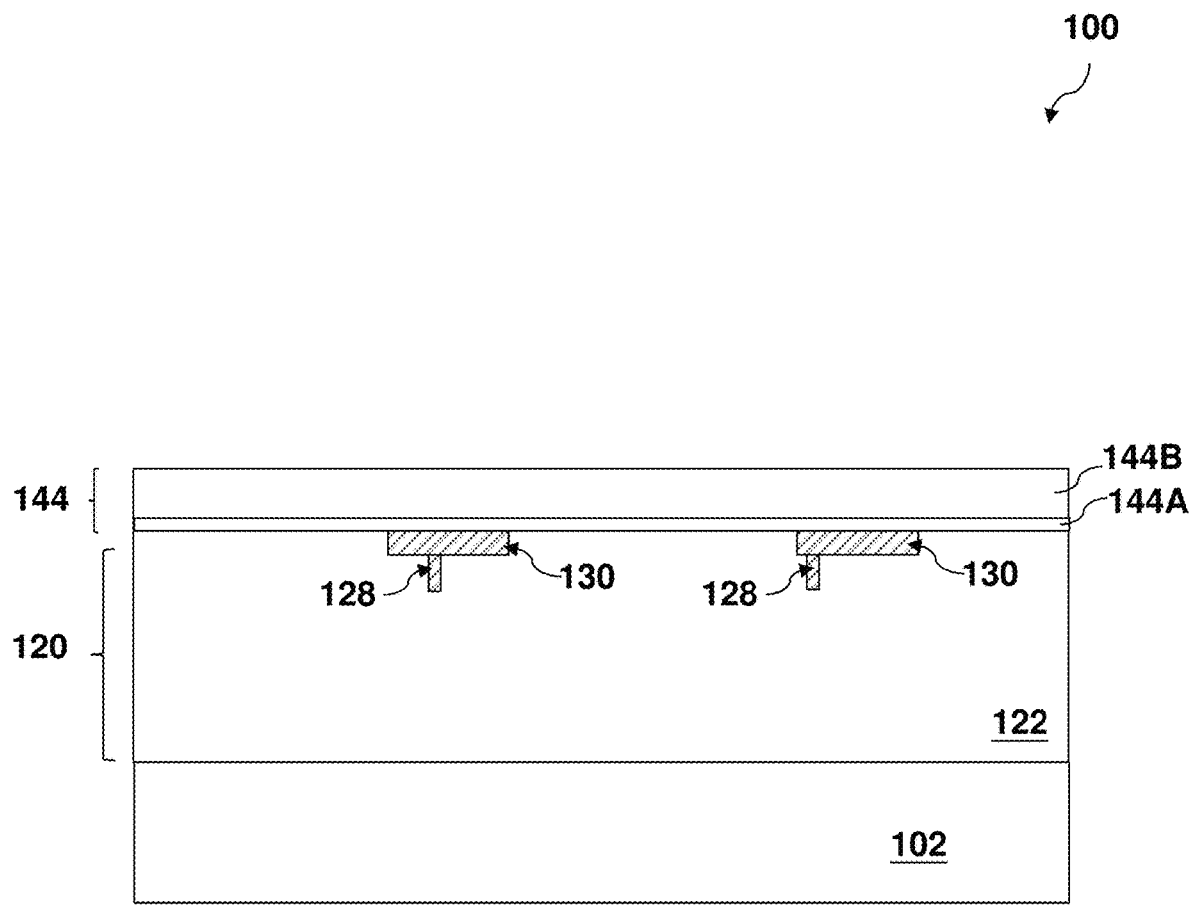
FIGS. 5, 6, 7, 8, 9, and 10 illustrate sectional views of an integrated circuit structure during various fabrication stages during the method of FIG. 3, constructed in accordance with some embodiments.

Referring to block 302 of FIG. 3 and FIG. 5, the method 208 includes an operation to deposit a first passivation layer 144 on the interconnection structure 120. FIG. 5 (other figures as well) skips some features (such as isolation features 104, IC devices, contacts 124, metal lines 126 and vias 128) on the substrate 102 and the interconnection structure 120 for simplicity. The first passivation layer 144 includes one or more dielectric material layers. In the present embodiment, the first passivation layer 144 includes a first dielectric material layer 144A and a second dielectric material layer 144B disposed on the first dielectric material layer 144A. In furtherance of the embodiment, the first dielectric material layer 144A includes silicon nitride (SiN) and has a thickness ranging between 500 angstrom and 1000 angstrom; and the second dielectric material layer 144B includes un-doped silica glass (USG) and has a thickness ranging between 5000 angstrom and 10000 angstrom. The passivation layer 144 is deposited by a suitable deposition technology, such as CVD, high density plasma CVD (HDP-CVD), other suitable technology or a combination thereof. The operation 302 may include multiple steps to deposit different dielectric material layers with respective precursors.

Figure 6:
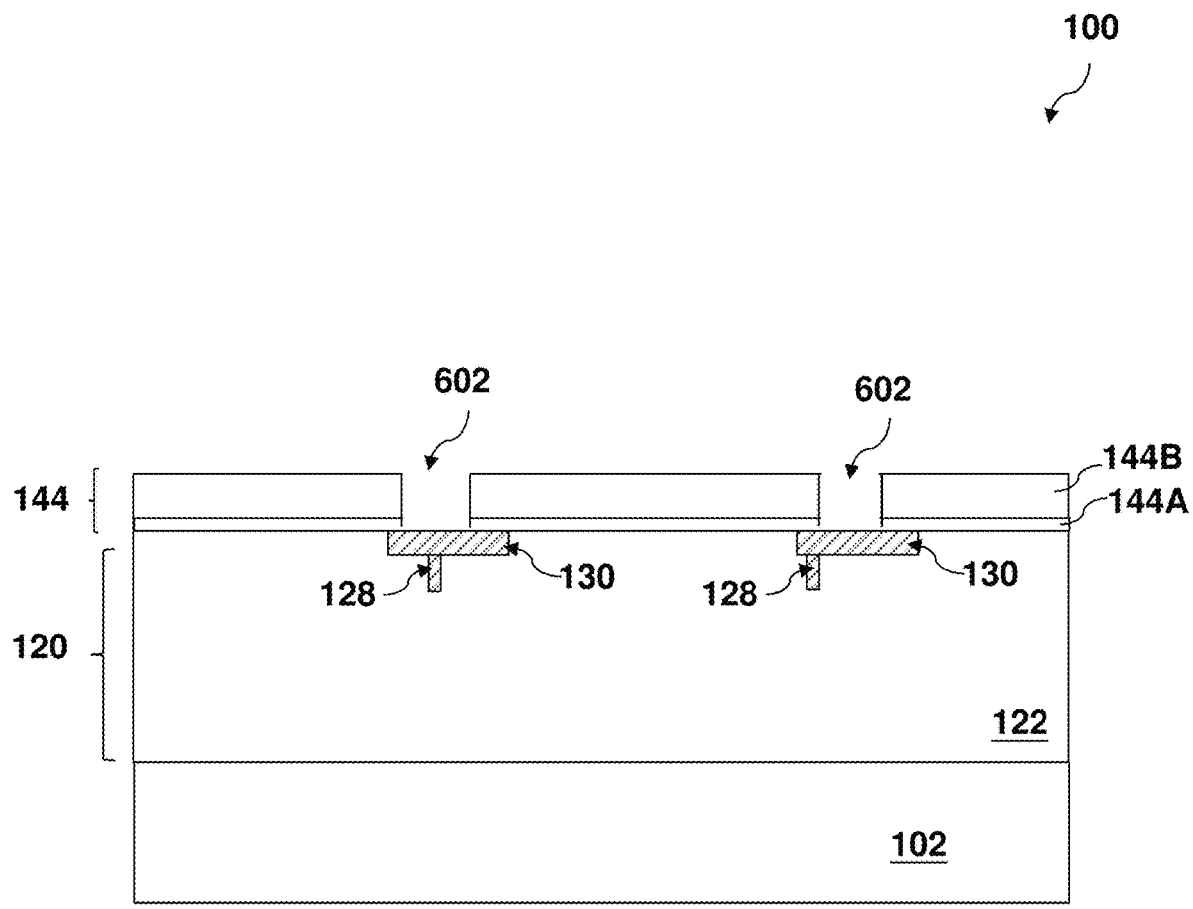

Referring to block 304 of FIG. 3 and FIG. 6, the method 208 includes an operation to pattern the first passivation layer 144 to form RV holes 602, which are aligned with respective top metal lines 130 so that the respective top metal lines 130 are exposed within the RV holes. In some embodiments, a RV hole 602 has a dimension ranging between 5 micron and 20 micron. The patterning process in the operation 304 includes lithography process and etching. In some examples, a patterned photoresist layer is formed by lithography process that further includes spin-on coating, exposure, developing, and one or more baking steps. An etching process is applied to the first passivation layer 144 through openings of the patterned photoresist (or resist) layer to form RV holes in the first passivation layer. The etching process may include dry etching, wet etching, or a combination thereof. The etching process may include multiple etching steps with different etchants to etch respective dielectric material layers. For example, the etching process may include a first etching process using buffered hydrofluoric acid to etch the USG layer 144B and phosphoric acid to etch the SiN layer 144A. In some examples, the operation 304 may uses a patterned hard mask to define the regions for RV holes. The formation of the patterned hard mask may include depositing a hard mask layer; forming a patterned resist layer by a lithography process; etching the hard mask through the openings of the patterned resist layer; and removing the patterned resist layer by wet stripping or plasma ashing.

Figure 7:
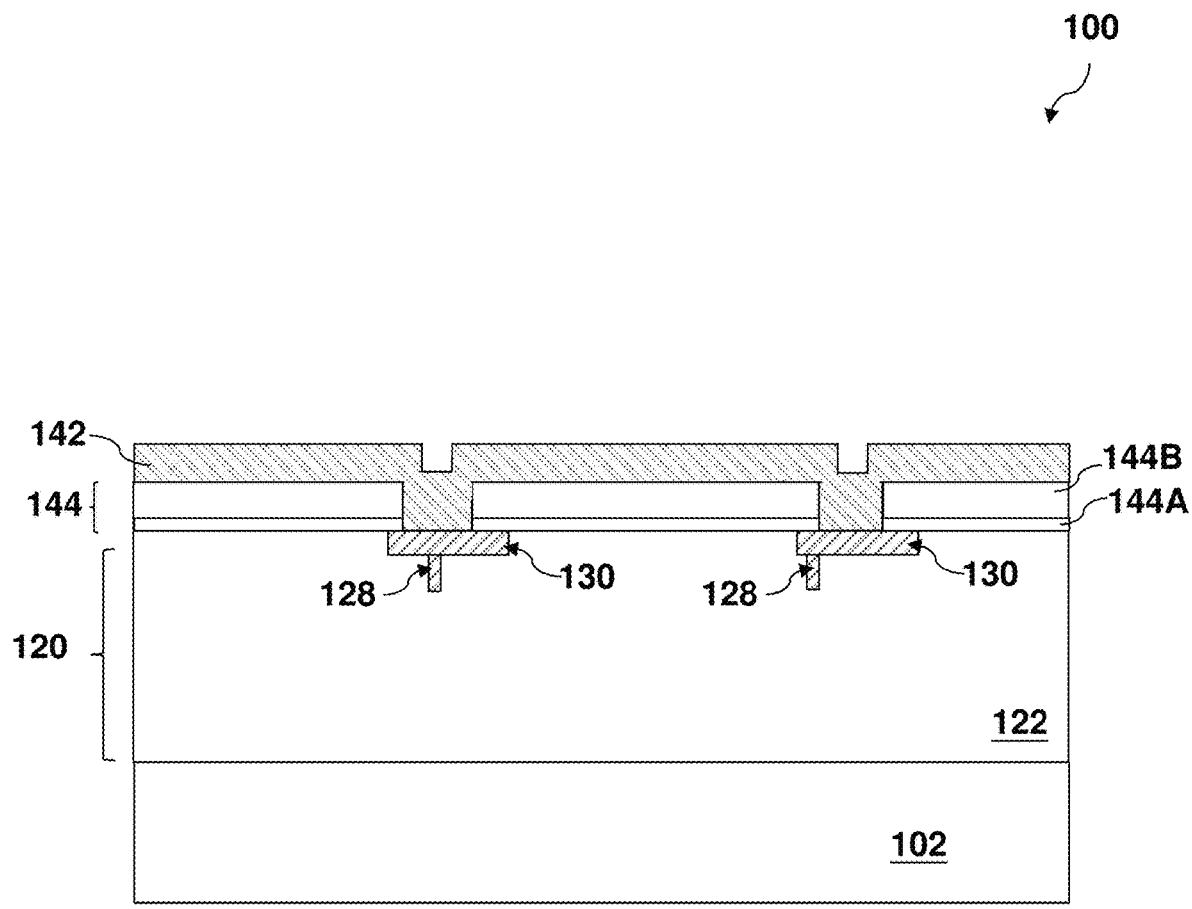

Referring to block 306 of FIG. 3 and FIG. 7, the method 208 includes an operation to form a RDL metallic layer 142 on the first passivation layer 144 and on the top metal lines 130 within the RV holes 602. The RDL metallic layer 142 directly contacts the top metal lines 130 through the RV holes. The RDL layer 142 includes multiple films formed by multiple steps. The structure and formation of the RDL layer 142 will be further described in details later.

Figure 8:
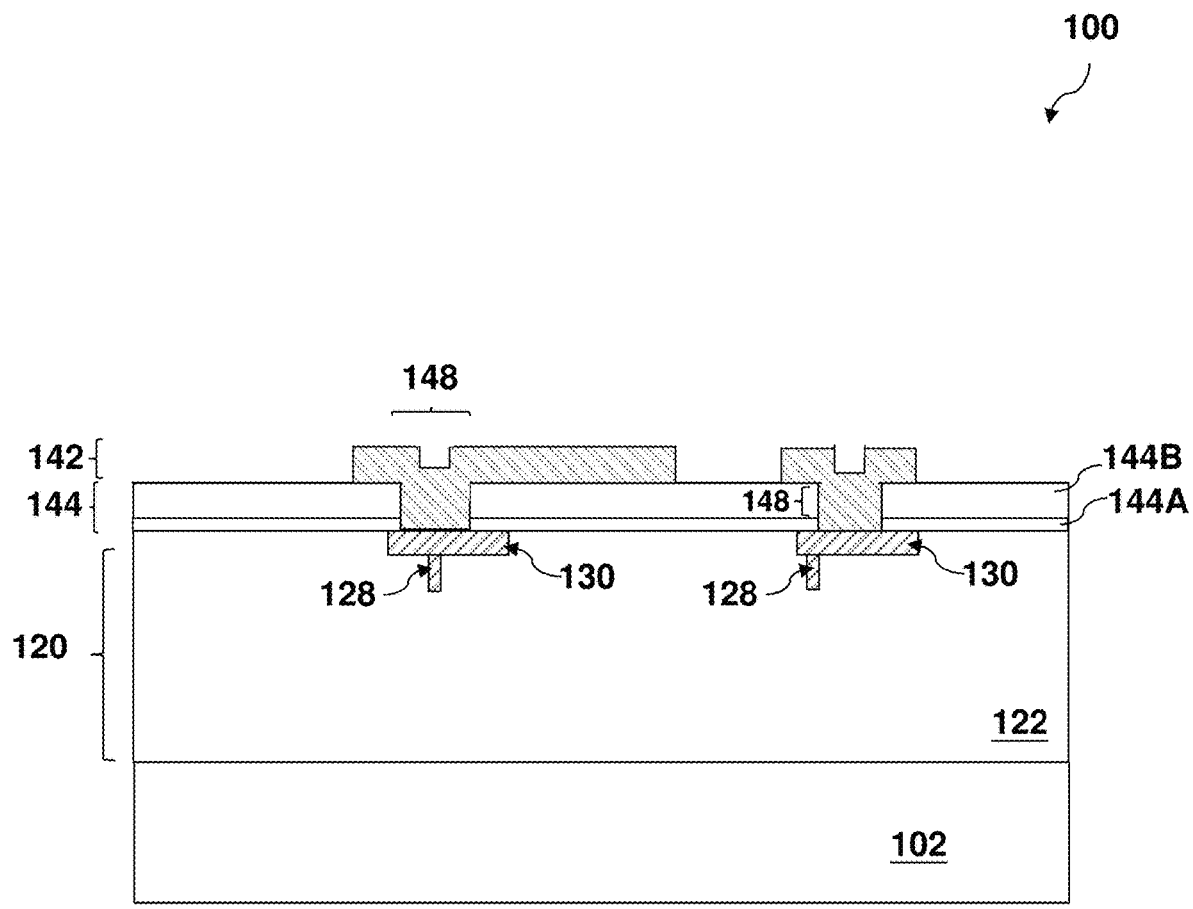

Referring to block 308 of FIG. 3 and FIG. 8, the method 208 proceeds to an operation by patterning the RDL layer 142 to form RDL metallic features (still labeled with numerical 142). The patterning process in the operation 308 includes lithography process and etching. Similarly, a patterned resist layer is formed by lithography process; and an etching process is applied to the RDL metallic layer to form RDL metallic features. The etching process may include dry etching, wet etching, or a combination thereof. The etching process may include multiple etching steps with different etchants to etch respective films in the RDL metallic layer. In some examples, the operation 308 may uses a patterned hard mask to define the regions for the portions of the RDL metallic layer to be removed.

After the completion of the operation 308, the RDL metallic features 142 are formed on the first passivation layer 144. Each RDL metallic feature 142 includes a portion 148 vertically extends to and directly contact the respective top metal line 130, the portion 148 being also referred to as RV pad 148.

Figure 9:
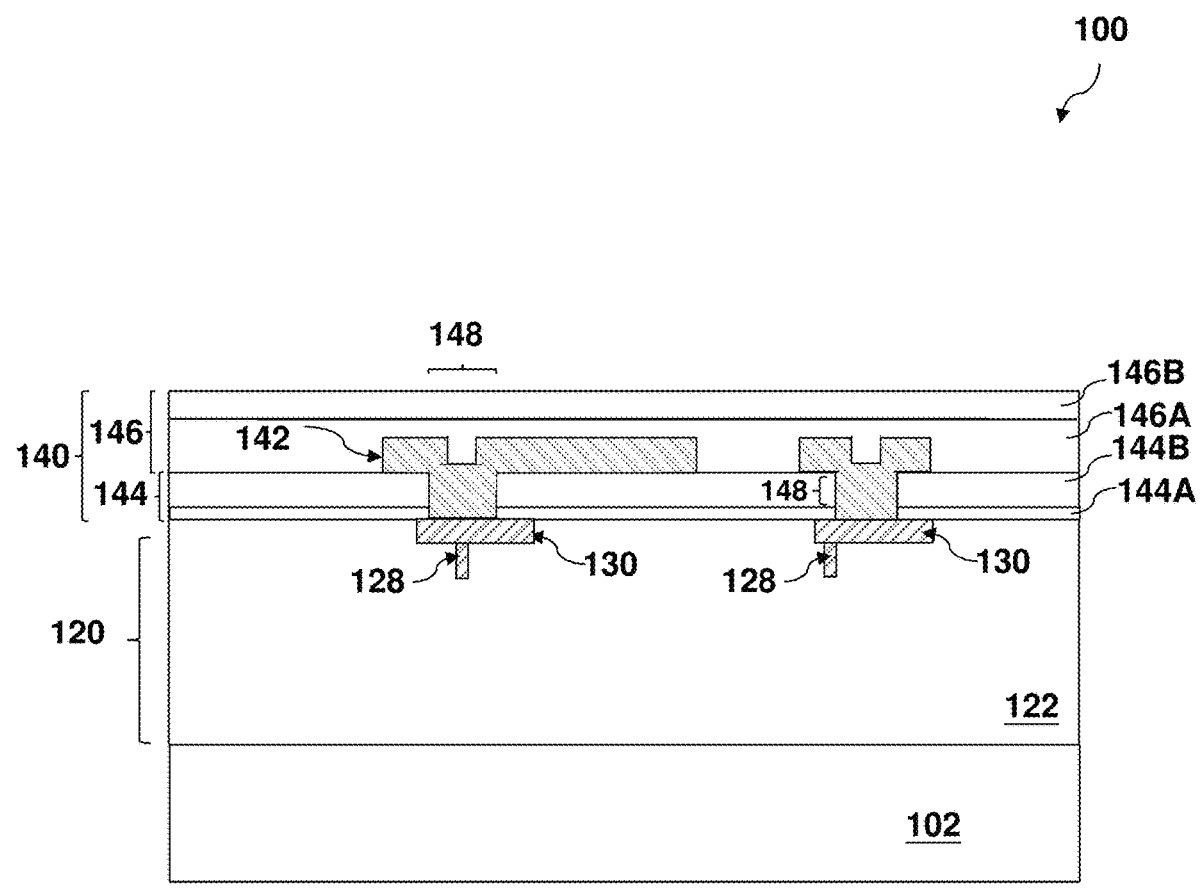

Referring to block 310 of FIG. 3 and FIG. 9, the method 208 includes an operation to deposit a second passivation layer 146 on the first passivation layer 144 and the RDL metallic features 142. The second passivation layer 146 includes one or more dielectric material layers. In the present embodiment, the second passivation layer 146 includes a first dielectric material layer 146A and a second dielectric material layer 146B disposed on the first dielectric material layer 146A. In furtherance of the embodiment, the first dielectric material layer 146A includes USG and has a thickness ranging between 2000 angstrom and 4000 angstrom; and the second dielectric material layer 146B includes SiN and has a thickness ranging between 2000 angstrom and 6000 angstrom. The second passivation layer 146 is deposited by a suitable deposition technology, such as HDPCVD, other suitable technology or a combination thereof. The operation 310 may include multiple steps to deposit different dielectric material layer with respective precursors.

Figure 10:
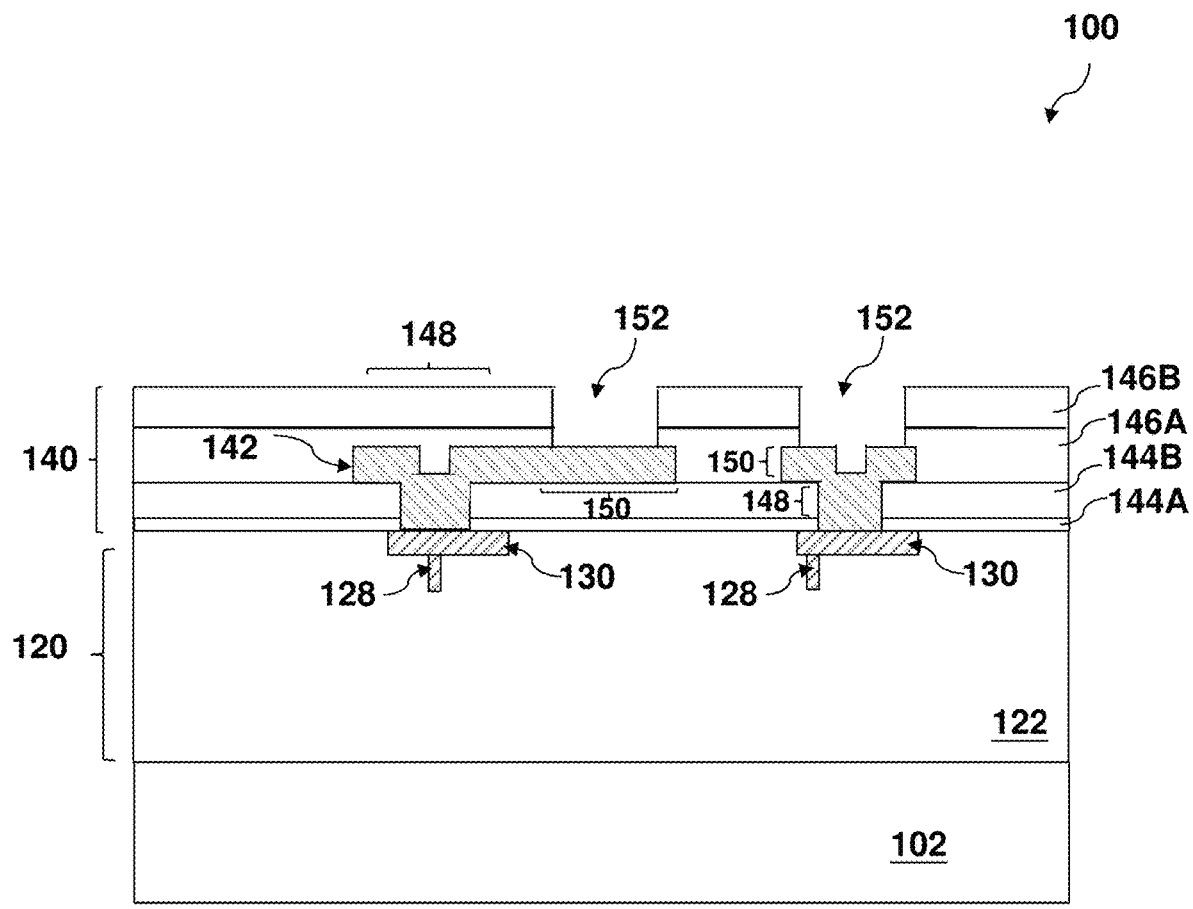

Referring to block 312 of FIG. 3 and FIG. 10, the method 208 includes an operation to pattern the second passivation layer 146 to form openings 152. A portion 150 of the RDL metallic feature 142 is exposed within the corresponding opening 152. The portion 150 functions as a bonding pad. For example, solder ball may be further formed on the bonding pad 150 and will be connected to the corresponding conductive feature in a circuit board during wafer scale chip bonding. In some embodiment, the opening 152 has a dimension ranging between 10 micron and 30 micron. A RDL metallic feature 142 vertically extends from the second passivation layer 146 to the first passivation layer 144 to directly contact the corresponding top metal line 130 within the RV hole and horizontally extends from the RV pad 148 to the bonding pad 150 to redistribute the bonding locations, such as from the chip edge to the chip center.

The patterning process in the operation 312 includes lithography process and etching. In some examples, a patterned resist layer is formed by lithography process. An etching process is applied to the second passivation layer 146 through openings of the patterned resist layer to form openings 152 in the second passivation layer 146. The etching process may include dry etching, wet etching, or a combination thereof. The etching process may include multiple etching steps with different etchants to etch respective dielectric material layers. For example, the etching process may include a first etching process using buffered hydrofluoric acid to etch the USG layer 146A and phosphoric acid to etch the SiN layer 146B. In some examples, the operation 312 may uses a patterned hard mask to define the openings 152.

Figure 11:
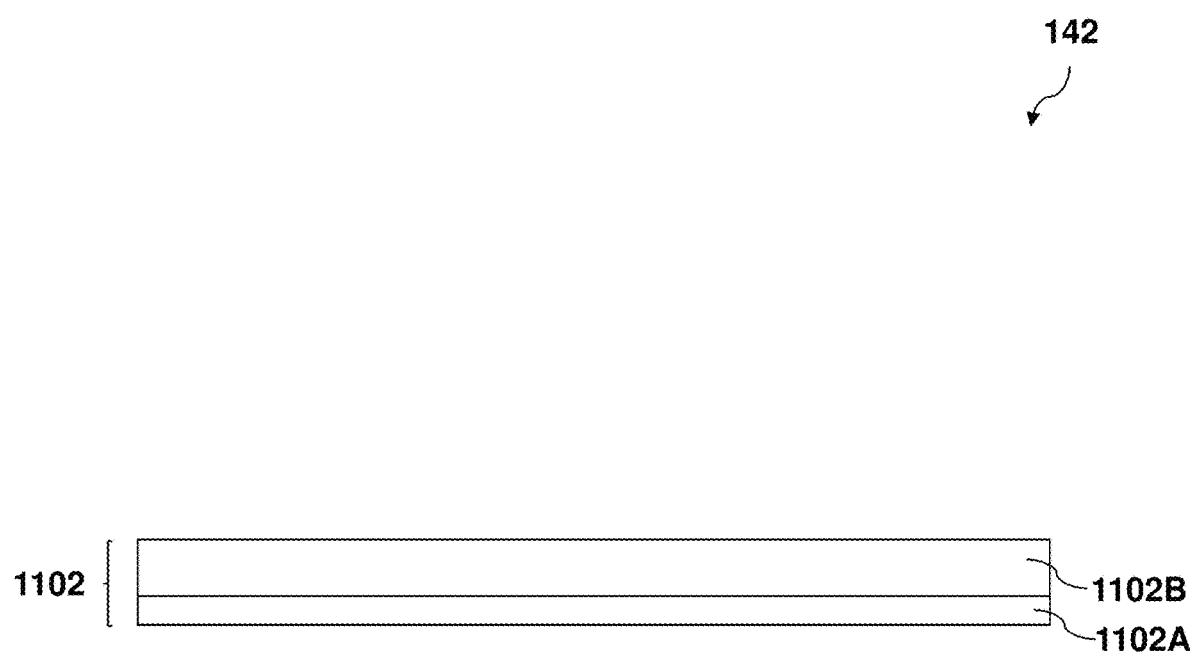
FIGS. 11, 12, and 13 illustrate sectional views of an RDL metallic layer during various fabrication stages during the method of FIG. 7, constructed in accordance with some embodiments.
Figure 12:
Figure 13:
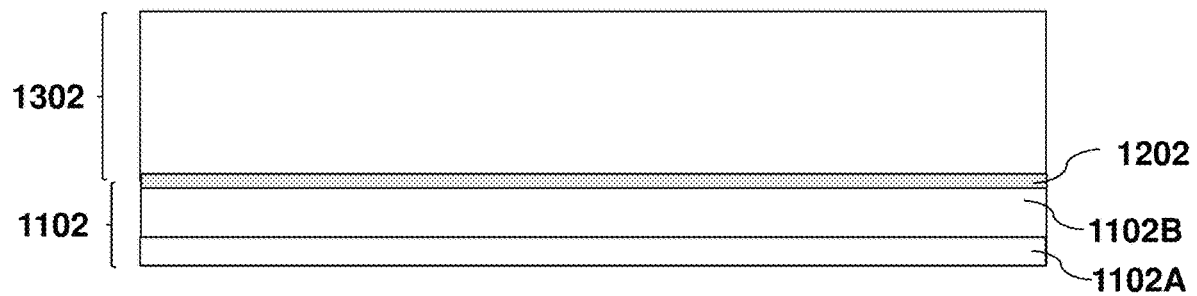

Now referring back to FIG. 3, the operation 306 to form the RDL layer 142 is previously described and is now further described in details with reference to FIGS. 4 and 11-13. FIG. 4 is a flowchart of a method 306 to form the RDL metallic layer 142; and FIGS. 11 through 13 are sectional views of the RDL metallic layer at various fabrication stages in accordance with some embodiments. For simplicity, FIGS. 11-13 only illustrate various conductive films of the RDL metallic layer 142.

Referring to block 402 of FIG. 4, the method 306 includes an operation to perform a degas process to semiconductor structure 100. The degas process is performed in an inert gas environment (such as argon) at a high temperature to dehydrate the semiconductor structure 100. According to some examples, the degas process is performed at a temperature ranging between 200° C. and 400.0 with a degas duration ranging from 30 sec to 300 sec. In the present embodiment, the degas process is implemented in a PVD tool, such as a PVD cluster tool with plurality of processing chambers.

Referring to block 404 of FIG. 4, the method 306 proceeds to an operation to perform a remote-plasma-cleaning (RPC) process to the semiconductor structure 100 to clean thereof, particularly the top metal lines 130. The RPC process removes particles, residuals and other contaminations from the top metal lines. The RPC process is performed in a gas environment in a plasma condition. In the present embodiment, the RPC process includes a gas of hydrogen and helium at the room temperature. According to some examples, hydrogen is between 3% and 10% (atomic percentage) and the helium is between 97% and 90% of the gas. In some examples, the gas pressure ranges between 10 millitorr (mTorr) and 30 mTorr. EF power to generate plasma ranges between 500 W and 1500 W. RPC treatment duration ranges between 30 sec and 300 sec. In the present embodiment, the RPC process is implemented in the same PVD tool.

Referring to block 406 of FIG. 4 and FIG. 11, the method 306 includes an operation to deposit a barrier layer 1102 on the first passivation layer 144 and the top metal lines 130 within the RV holes. The barrier layer 1102 may include tantalum (Ta), tantalum nitride (TaN), titanium (Ti), titanium nitride (TiN), other suitable material, or a combination thereof. In the present embodiment, the barrier layer 1102 includes a Ta film 1102A and a TaN film 1102B. In some examples, the Ta film 1102A has a thickness ranges between 5 angstrom and 30 angstrom; and the TaN film 1102B has a thickness ranges between 400 angstrom and 800 angstrom. In the present embodiment, the deposition of the barrier layer 1102 is also implemented in the same PVD tool. For example, in one deposition chamber, tantalum is deposited using a tantalum target and then then tantalum nitride is deposited with additional nitrogen gas in the same chamber or a different deposition chamber. In the present embodiment, the barrier layer 1102 has a polycrystalline structure.

Referring to block 408 of FIG. 4, the method 306 proceeds to an operation to perform a cooling process to the semiconductor structure 100. For example, the cooling process is implemented in an inert gas (such as argon) environment for a suitable duration, such as a duration between 20 sec and 60 sec. The cooling process is also carried on in the same PVD tool.

Referring to block 410 of FIG. 4 and FIG. 12, the method 306 includes an operation to perform an oxygen treatment to the barrier layer 1102, thereby forming a diffusion layer 1202. The diffusion layer 1202 is a metallic oxide layer that includes oxygen and a metal. In the present embodiment, the diffusion layer 120 includes oxygen and tantalum. In other embodiments, the diffusion layer 1202 further includes nitrogen. The diffusion layer 1202 may have a thickness ranging between 5 angstrom and 30 angstrom. The diffusion layer 1202 has a graded composition with a maximum oxygen concentration at the top surface of the diffusion layer 1202. In some examples, the maximum oxygen concentration is greater than 35% (atomic percentage) but less than 45%. In the present embodiment, the diffusion layer 1202 has an amorphous structure while the barrier layer 1102 has a polycrystalline structure.

During the oxygen treatment, oxygen diffuses into the barrier layer 1102. The oxygen treatment is also implemented in the same PVD tool. The oxygen treatment is in an oxygen environment at room temperature with oxygen flow rate ranging between 1 sccm and 20 sccm. In some embodiments, plasma may be applied to the oxygen gas with a low plasma power, such as in a range between 500 W and 1500 W, so that the oxygen concentration is controlled at a low level to maintain a suitable contact resistance.

Referring to block 412 of FIG. 4, the method 306 includes an operation to perform a second degas process to semiconductor structure 100 after the formation of the barrier layer 1102 and the diffusion layer 1202. The second degas process is similar to the first degas process in the operation 402. For example, the second degas process is performed in an argon environment at a high temperature to dehydrate the semiconductor structure 100. According to some examples, the degas process is performed at a temperature ranging between 200° C. and 400.0 with a degas duration ranging from 30 sec to 300 sec. In the present embodiment, the degas process is implemented in the same PVD tool.

Referring to block 414 of FIG. 4, the method 306 proceeds to an operation to perform a second RPC process to the semiconductor structure 100 to clean thereof, particularly to clean the barrier layer 1102 and the diffusion layer 1202. The second RPC process removes particles, residuals and other contaminations, such as from those metallic material layers. The second RPC process is similar to the first RPC process in the operation 404. For example, the second RPC process is performed in a gas environment in a plasma condition. In the present embodiment, the second RPC process includes a gas of hydrogen and helium at the room temperature. According to some examples, hydrogen is between 3% and 10% and the helium is between 97% and 90% of the gas. In some examples, the gas pressure ranges between 10 mTorr and 30 mTorr. EF power to generate plasma ranges between 500 W and 1500 W. The second RPC treatment duration ranges between 30 sec and 300 sec. In the present embodiment, the RPC process is implemented in the same PVD tool.

Referring to block 416 of FIG. 4 and FIG. 13, the method 306 includes an operation to deposit a metallic layer 1302 on the diffusion layer 1202. The metallic layer 1302 may include aluminum, copper, tungsten, other suitable metal or metal alloy, or a combination thereof. In the present embodiment, the metallic layer 1302 includes an aluminum copper (AlCu) alloy. In furtherance of the embodiment, the AlCu layer 1302 includes about 99.5% aluminum and about 0.5% copper. The AlCu layer 1302 is deposited by sputtering in the PVD tool at a high deposition temperature greater than 300° C., such as a temperature ranging between 300° C. and 500° C. In some examples, the deposition temperature ranges between 350° C. and 450° C. In the present embodiment, thus formed AlCu layer 1302 has a polycrystalline structure. Particularly, the grain size of the AlCu layer 1302 substantially distributed in a range between 5 micron and 20 micron. In some embodiments, the AlCu layer 1302 has a grain size distribution with more than 50% polycrystalline grains of grain sizes greater than 1 micron. In some embodiments, the AlCu layer 1302 has a thickness ranges between 6000 angstrom and 12000 angstrom.

In the existing method, an AlCu layer is deposited at a cold condition, such as a deposition temperature less than 300° C. Thus deposited AlCu layer cannot properly fill in gaps (such as RV holes), leaving a tooth-like profile. This further leads to incomplete or improper filling of the second passivation layer 146, causing various performance and reliability issues. By implementing a hot deposition in the disclosed method, the AlCu layer 1302 has improved gap filling on one side but may cause metal extrusion on another side. Especially, tantalum in the barrier layer 1102 diffusion to the AlCu layer 1302 and induces TaN lattice vacancy, which provides further chances for copper from the top metal line 130 to form copper extrusion. Furthermore, aluminum in the AlCu layer 1302 easily forms aluminum extrusion by thermal stress. By forming the diffusion layer 1202 that interposes between and separates the AlCu layer 1302 and the barrier layer 1202, various metal extrusions are effectively eliminated or substantially reduced. The disclosed method with hot deposition of the AlCu layer 1302 and oxygen treatment to form the diffusion layer 1202, both the filling issues and the metal extrusion issue are improved.

During the operation 416 to deposit the AlCu layer 1302, due to the high temperature deposition, aluminum from the AlCu layer 1302 may diffuse to the diffusion layer 1202. In this case, the diffusion layer 1202 also includes aluminum. In some embodiments, the diffusion layer 1202 includes tantalum, oxygen, aluminum and nitrogen.

Additionally, all above operations in the method 306 are implemented in various chambers of a cluster PVD. When the workpiece 100 is sent into the PVD tool through a loadlock and will be sent out after the completion of the above operations. Thus, the manufacturing cost is reduced and contamination among the operations is avoided. For example, the PVD cluster tool includes one or more degas chambers, one or more pre-clean chambers, one or more pass-through chambers, and a plurality of deposition chambers. In furtherance of the example, a degas operations is implemented in a degas chamber; a RPC operation is implemented in a pre-clean chamber; a cooling operation may be implemented in a pass-through chamber; various deposition operations (Ta, TaN and AlCu depositions) are implemented in various deposition chambers; and the oxygen treatment is implemented in a degas chamber, a pre-clean chamber, or a deposition chamber.

Figure 14:
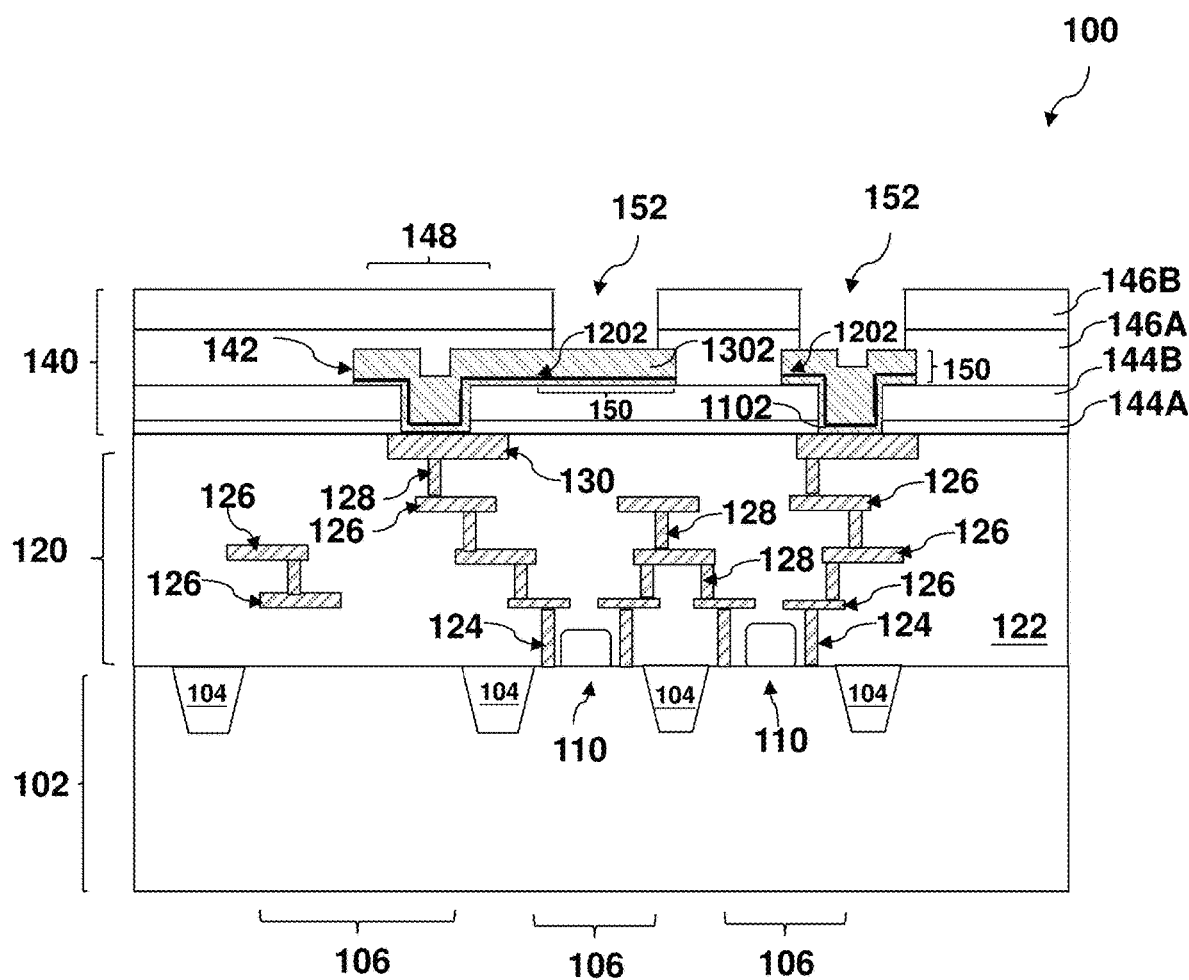
FIG. 14 illustrates a sectional view of an integrated circuit structure having a RDL structure, constructed in accordance with some embodiments.

Thus formed semiconductor structure 100 by the method 200 is further illustrated in FIG. 14 in a sectional view, constructed in accordance with some embodiments. Particularly, the RDL structure 140 is formed by the method 208. More specifically, the RDL metallic layer 142 is formed by the method 306. Both the method 208 and the method 306 are portions of the method 200 but being detailed with multiple sub-operations.

The method 200 may additionally include other operations before, during or after the operations described above. The semiconductor structure may further include other features. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The present disclosure provides a semiconductor structure 100 and a method 200 making the same in various embodiments. The semiconductor structure includes a RDL structure having RDL metallic features formed using a high temperature deposition and an oxygen treatment to form a diffusion layer containing a metal and oxygen. By implementing the disclosed method in various embodiments, some of advantages described below may present. However, it is understood that different embodiments disclosed herein offer different advantages and that no particular advantage is necessarily required in all embodiments. As one example, the AlCu layer 1302 is formed in a PVD tool by sputtering at a high temperature; the gas filling is substantially improved. A diffusion layer 1202 is formed between the barrier layer 1102 and the AlCu layer 1302, which prevents the metal extrusion.

Thus, the present disclosure provides an integrated circuit (IC) structure in accordance with some embodiments. The IC structure includes a semiconductor substrate having IC devices formed thereon; an interconnection structure formed on the semiconductor substrate, wherein the interconnection structure includes contacts, vias and metal lines coupled to the IC devices; and a redistribution layer (RDL) metallic feature formed on the interconnection structure and directly landing on a top metal line of the interconnection structure. The RDL metallic feature further includes a barrier layer disposed on the top metal line; a diffusion layer disposed on the barrier layer, wherein the diffusion layer includes metal and oxygen; and a metallic layer disposed on the diffusion layer.

The present disclosure also provides an IC structure in accordance with some other embodiments. The IC structure includes a semiconductor substrate having IC devices formed thereon; an interconnection structure formed on the semiconductor substrate, wherein the interconnection structure includes a plurality of conductive features coupled to the IC devices; and a redistribution layer (RDL) metallic feature formed on the interconnection structure and directly landing on one conductive feature of the plurality of conductive features. The RDL metallic feature further includes a barrier layer disposed on the conductive feature; a diffusion layer disposed on the barrier layer, wherein the diffusion layer is a metallic oxide in an amorphous structure; and a metallic layer disposed on the diffusion layer. The RDL metallic feature is electrically connected to the conductive feature through the barrier layer and the diffusion layer.

The present disclosure provides a method of fabricating an integrated circuit (IC) structure in accordance with some embodiments. The method includes forming IC devices on a semiconductor substrate; forming an interconnection structure on the semiconductor substrate, wherein the interconnection structure includes a plurality of conductive features coupled with the IC devices; forming a first passivation layer on the interconnection structure, wherein the first passivation layer includes a first opening that exposes a top conductive feature of the plurality of the conductive features; depositing a barrier layer on the first passivation layer and on the top conductive feature within the first opening; performing an oxygen treatment to the barrier layer to form a diffusion layer; depositing a metallic layer on the diffusion layer; patterning the metallic layer, the diffusion layer and the barrier layer to form a redistribution layer (RDL) metallic feature; and forming a second passivation layer on the RDL metallic feature and the first passivation layer. The RDL metallic feature extends from the top conductive feature to a second opening of the second passivation layer as a bonding pad.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) structure, comprising:
a semiconductor substrate;
an interconnection structure formed on the semiconductor substrate and including a top metal feature within a first region;
a passivation layer disposed on the interconnection structure and having an opening within a second region being distanced away from the first region; and
a redistribution layer (RDL) metallic feature formed in the passivation layer, wherein the RDL metallic feature is landing on the top metal feature, and horizontally extends from the top metal feature in the first region to the opening in the second region, and wherein the RDL metallic feature further includes
a barrier layer disposed directly on the top metal feature, wherein the barrier layer includes a metal and nitrogen;
a diffusion layer disposed directly on the barrier layer, wherein the diffusion layer includes the metal and oxygen; and
a metallic layer disposed directly on the diffusion layer.

2. The IC structure of claim 1, wherein
the RDL metallic feature is electrically connected to the top metal feature of the interconnection structure through the barrier layer and the diffusion layer;
the diffusion layer is different from the barrier layer in composition; and
each of the barrier layer, the diffusion layer and the metallic layer extends from the first region to the second region.

3. The IC structure of claim 2, wherein the passivation layer has a topmost surface above a topmost surface of the RDL metallic feature; and
the passivation layer has a bottom surface being coplanar with a bottom surface of the RDL metallic feature.

4. The IC structure of claim 3, wherein the diffusion layer has a graded oxygen concentration from a top surface to a bottom surface of the diffusion layer with a maximum oxygen concentration greater than 35% at the top surface.

5. The IC structure of claim 2, wherein
the barrier layer includes a tantalum film and a tantalum nitride film on the tantalum film; and
the diffusion layer includes tantalum, oxygen and nitrogen.

6. The IC structure of claim 5, wherein
the metallic layer includes aluminum in a polycrystalline structure; and
the diffusion layer further includes aluminum and is a metallic oxide layer in an amorphous structure.

7. The IC structure of claim 1, wherein the metallic layer includes aluminum in a polycrystalline structure with grain sizes substantially ranging between 5 micron and 20 micron.

8. The IC structure of claim 1, wherein the metallic layer includes aluminum in a polycrystalline structure with more than 50% polycrystalline grains of grain sizes greater than 1 micron.

9. The IC structure of claim 1, wherein
the passivation layer further includes a first passivation layer and a second passivation layer formed on the interconnection structure;
the first passivation layer includes a first silicon nitride layer and a first un-doped silica glass layer disposed on the first silicon nitride layer;
the second passivation layer includes a second un-doped silica glass layer disposed on the first un-doped silica glass layer and a second silicon nitride layer disposed on the second un-doped silica glass layer; and
the RDL metallic feature includes a first portion vertically extending from the first passivation layer to the second passivation layer within the first region, and a second portion in the second passivation layer and horizontally extending from the first region to the second region.

10. An integrated circuit (IC) structure, comprising:
a semiconductor substrate having IC devices formed thereon;

an interconnection structure formed on the semiconductor substrate and coupled to the IC devices, wherein the interconnection structure includes a top metal feature within a first region;

a passivation layer disposed on the interconnection structure and having an opening within a second region being distanced away from the first region; and a redistribution layer (RDL) metallic feature formed in the passivation layer and directly landing on the top metal feature of the interconnection structure, wherein the RDL metallic feature further includes a barrier layer disposed directly on the conductive feature;

a diffusion layer disposed directly on the barrier layer, wherein the diffusion layer is a metallic oxide in an amorphous structure and is different from the barrier layer in composition; and a metallic layer disposed directly on the diffusion layer, wherein the RDL metallic feature is electrically connected to the top metal feature through the barrier layer and the diffusion layer, wherein each of the barrier layer, the diffusion layer and the metallic layer of the RDL metallic feature horizontally extends from the first region to the second region.

11. The IC structure of claim 10, wherein the barrier layer, the diffusion layer and the metallic layer include first ends aligned at a first location in the first region and second ends aligned at a second location in the second region.

12. The IC structure of claim 10, wherein the diffusion layer has a graded oxygen concentration from a top surface to a bottom surface of the diffusion layer with a maximum oxygen concentration greater than 35% at the top surface.

13. The IC structure of claim 10, wherein
the barrier layer includes a tantalum film and a tantalum nitride film disposed on the tantalum film;
the metallic layer includes aluminum; and
the diffusion layer includes tantalum, aluminum, oxygen and nitrogen.

14. The IC structure of claim 10, wherein the metallic layer includes aluminum in polycrystalline structure with more than 50% of polycrystalline grains having grain sizes greater than 1 micron.

15. The IC structure of claim 10, wherein the passivation layer further includes a first passivation layer and a second passivation layer formed on the interconnection structure, wherein
the first passivation layer includes a first silicon nitride layer and a first un-doped silica glass layer disposed on the first silicon nitride layer;
the second passivation layer includes a second un-doped silica glass layer disposed on the first un-doped silica glass layer and a second silicon nitride layer disposed on the second un-doped silica glass layer; and
the RDL metallic feature includes a first portion vertically extending from the first passivation layer to the second passivation layer within the first region, and a second portion in the second passivation layer and horizontally extending from the first region to the second region, wherein the second portion is partially exposed within the opening of the passivation layer as a bonding pad.

16. An integrated circuit (IC) structure, comprising:

a semiconductor substrate having IC devices formed thereon;

an interconnection structure formed on the semiconductor substrate, wherein the interconnection structure includes a top metal feature within a first region coupled to the IC devices;

a passivation layer disposed on the interconnection structure and having an opening within a second region being distanced away from the first region; and a redistribution layer (RDL) metallic feature embedded in the passivation layer, landing on the top metal feature, and horizontally extending from the top metal feature in the first region to the opening in the second region, wherein the RDL metallic feature further includes a barrier layer disposed directly on the top metal feature, the barrier layer includes tantalum and nitrogen;

a diffusion layer disposed directly on the barrier layer and being different from the barrier layer in composition, wherein the diffusion layer includes nitrogen, oxygen and tantalum; and a metallic layer disposed directly on the diffusion layer, wherein the RDL metallic feature is electrically connected to the top metal feature through the barrier layer and the diffusion layer, wherein the passivation layer includes a first silicon nitride film and an un-doped silica film on the first silicon nitride film, and a second silicon nitride film on the un-doped silica film, and wherein the RDL metallic feature includes a topmost surface below a bottom surface of the second silicon nitride film.

17. The IC structure of claim 16, wherein the diffusion layer has a graded oxygen concentration from a top surface to a bottom surface of the diffusion layer with a maximum oxygen concentration greater than 35% at the top surface.

18. The IC structure of claim 16, wherein
the barrier layer includes a tantalum film and a tantalum nitride film disposed on the tantalum film;
the diffusion layer includes tantalum, aluminum, oxygen and nitrogen;
the metallic layer includes aluminum.

19. The IC structure of claim 16, wherein the metallic layer includes aluminum in polycrystalline structure with more than 50% of polycrystalline grains having grain sizes greater than 1 micron.

20. The IC structure of claim 16, wherein the barrier layer, the diffusion layer and the metallic layer include first ends aligned at a first location in the first region and second ends aligned at a second location in the second region.

* * * * *